(12) United States Patent
Willis et al.

(10) Patent No.: US 7,458,821 B2
(45) Date of Patent: Dec. 2, 2008

(54) ELECTRICAL INTERFACE FOR MEMORY CONNECTOR

(75) Inventors: Dan Willis, Portland, OR (US); David Kraus, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 238 days.

(21) Appl. No.: 11/296,632

(22) Filed: Dec. 7, 2005

(65) Prior Publication Data

US 2007/0128896 A1    Jun. 7, 2007

(51) Int. Cl.
*H01R 12/00*    (2006.01)

(52) U.S. Cl. .............................. 439/74; 439/77; 439/79; 361/803

(58) Field of Classification Search .................. 439/79, 439/326, 260, 237, 74, 83; 361/772, 777, 361/755, 803
See application file for complete search history.

(56) References Cited

U.S. PATENT DOCUMENTS

| | | | | |
|---|---|---|---|---|
| 4,859,190 A | * | 8/1989 | Anderson | 439/78 |
| 5,511,985 A | * | 4/1996 | Noschese et al. | 439/157 |
| 5,852,725 A | * | 12/1998 | Yen | 361/784 |
| 5,961,352 A | * | 10/1999 | Denny et al. | 439/637 |
| 6,152,742 A | * | 11/2000 | Cohen et al. | 439/60 |
| 6,821,144 B2 | * | 11/2004 | Choy | 439/326 |
| 6,830,470 B1 | * | 12/2004 | Lynch et al. | 439/79 |
| 6,934,163 B2 | * | 8/2005 | Dow | 439/62 |
| 7,362,589 B2 | * | 4/2008 | Gay | 361/777 |
| 2006/0221590 A1 | * | 10/2006 | Campini et al. | 361/803 |

* cited by examiner

*Primary Examiner*—Briggitte R Hammond
(74) *Attorney, Agent, or Firm*—Buckley, Maschoff & Talwalkar LLC

(57) ABSTRACT

According to some embodiments, a connector to receive a memory module includes a first row of a first plurality of interconnect ends, a second row of a second plurality of interconnect ends adjacent to the first row, and a third row of a third plurality of interconnect ends adjacent to the second row. An interconnect end of the first plurality of interconnect ends, an interconnect end of the second plurality of interconnect ends, and an interconnect end of the third plurality of interconnect ends may be substantially aligned.

19 Claims, 13 Drawing Sheets

US 7,458,821 B2

ELECTRICAL INTERFACE FOR MEMORY CONNECTOR

BACKGROUND

A memory connector may couple a memory module to a substrate, such as a motherboard. This coupling may provide a physical connection between the substrate and the memory module as well as an electrical connection between conductive contacts on the substrate and conductive contacts of the memory module. For example, a memory connector may carry single-ended signals between a substrate and a Double Data Rate (DDR) Dual Inline Memory Module (DIMM).

More specifically, a memory connector may connect a substrate contact that is associated with a single ended signal to a DDR DIMM contact that is also associated with the single ended signal. More than one DDR DIMMs may be daisy-chained per memory channel. Due to signal routing considerations, conventional memory connectors may be used in conjunction with a four-layer motherboard (e.g., two signal layers, a power layer and a ground layer) to support, for example, two memory channels and four DDR DIMMs.

Differential signaling may be preferable to the aforementioned single-ended signaling in some circumstances. Differential signaling requires two traces, two substrate contacts, and two memory module contacts per signal. Existing Fully-Buffered DIMMs and other proposed DIMM technologies support differential signaling at a limit of one DIMM per memory channel. Conventional memory connectors and a four-layer motherboard may support up to three memory channels, and therefore up to three of the existing or proposed DIMMs. More than four substrate layers (e.g., six, eight or ten layers) are required in order to support four or more of such DIMMs.

DETAILED DESCRIPTION

Figure 1:
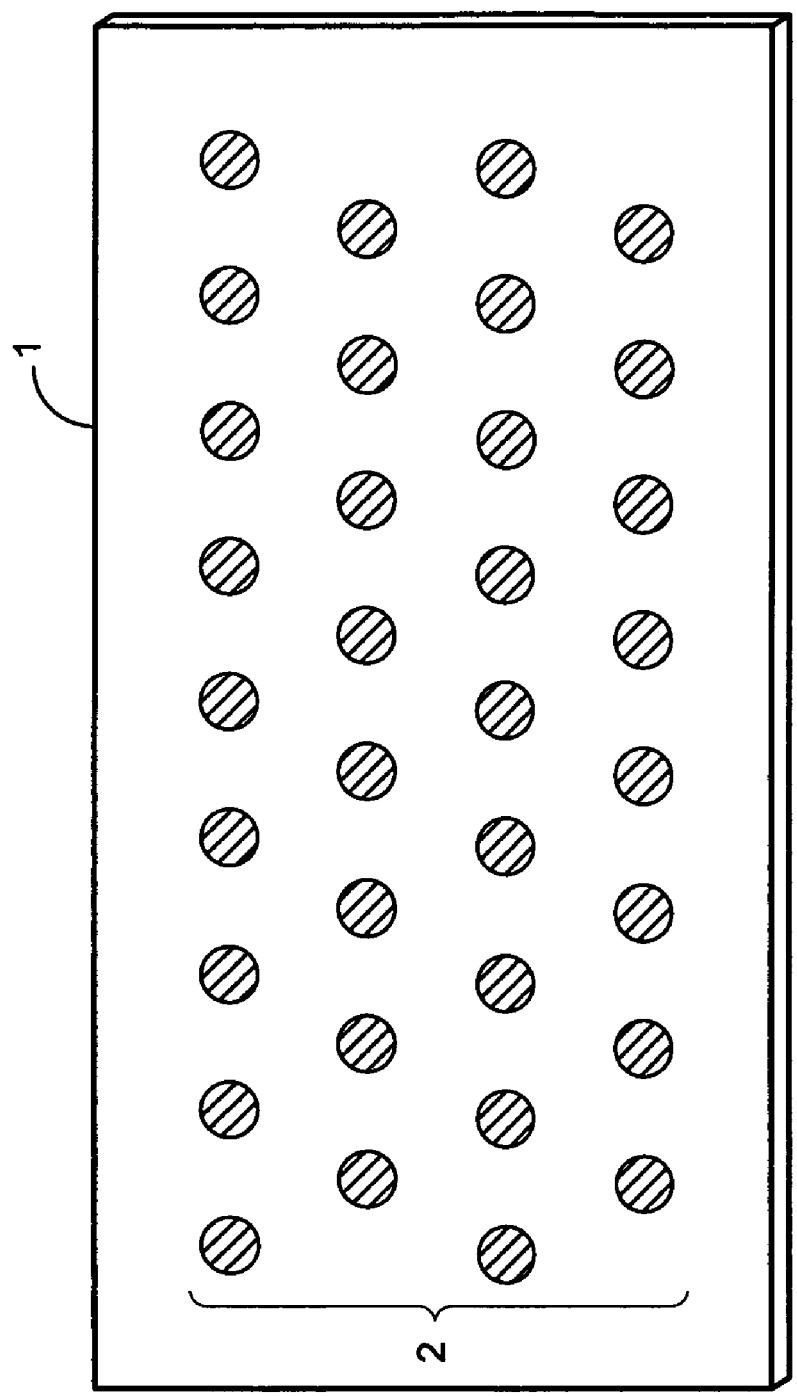
FIG. 1 is a top view of a portion of a conventional electrical interface for a memory connector.

FIG. 1 is a top view of a portion of a conventional electrical interface for a memory connector. Substrate 1 may comprise a motherboard including conductive contacts 2. Conductive contacts 2 may carry electrical signals between conductive traces (not shown) of motherboard 1 and respective interconnects of a memory connector. Conductive contacts 2 may comprise thirty-four of two hundred-forty conductive contacts for receiving a DDR-compliant memory connector. In this regard, conductive contacts 2 may be spaced apart by roughly 1 mm on center.

Figure 2:
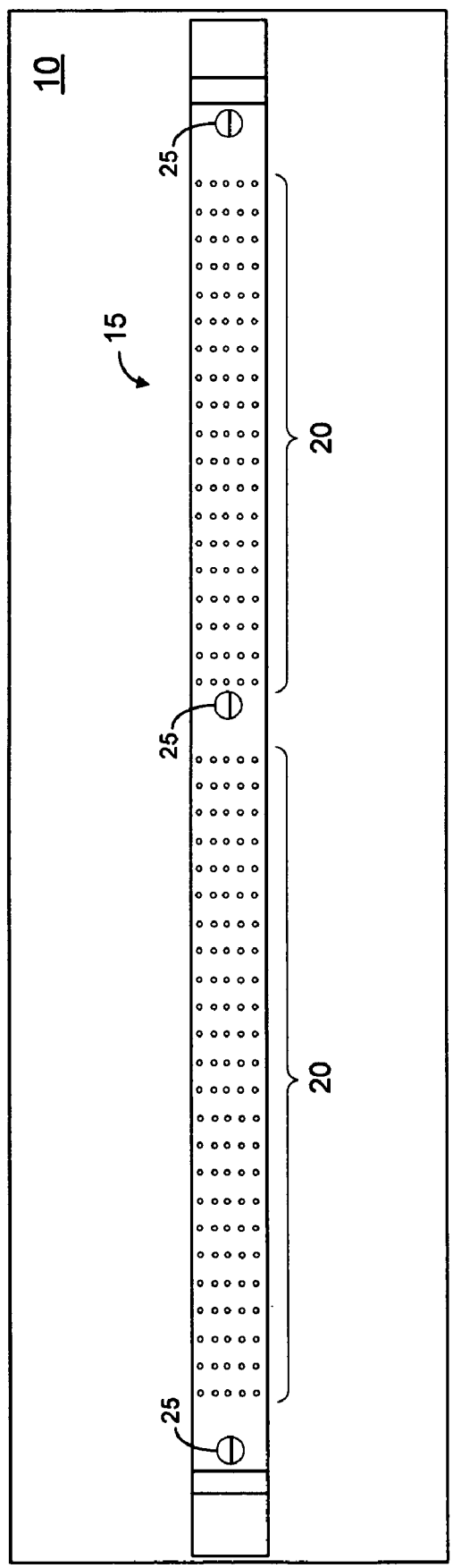
FIG. 2 illustrates a memory connector footprint according to some embodiments.

FIG. 2 illustrates a substrate including a memory connector footprint according to some embodiments. Substrate 10 includes footprint 15, which may be laid out thereon using currently- or hereafter-known techniques. Footprint 15 comprises an area of substrate 10 for receiving a memory connector, which is in turn to receive a memory module such as a DIMM.

Footprint 15 includes rows of conductive contacts 20 and mounting hole areas 25. Conductive contacts 20 are to receive respective electrical interconnects of a memory connector. Mounting hole areas 25 may receive elements of the memory connector for securing the memory connector to substrate 10.

As shown, and in contrast to contacts 2 of FIG. 1, contacts 20 of each row are substantially aligned with contacts 20 of an adjacent row. Some embodiments of the foregoing features may provide a four-layer substrate with improved support for high speed serial differential signaling.

Figure 3:
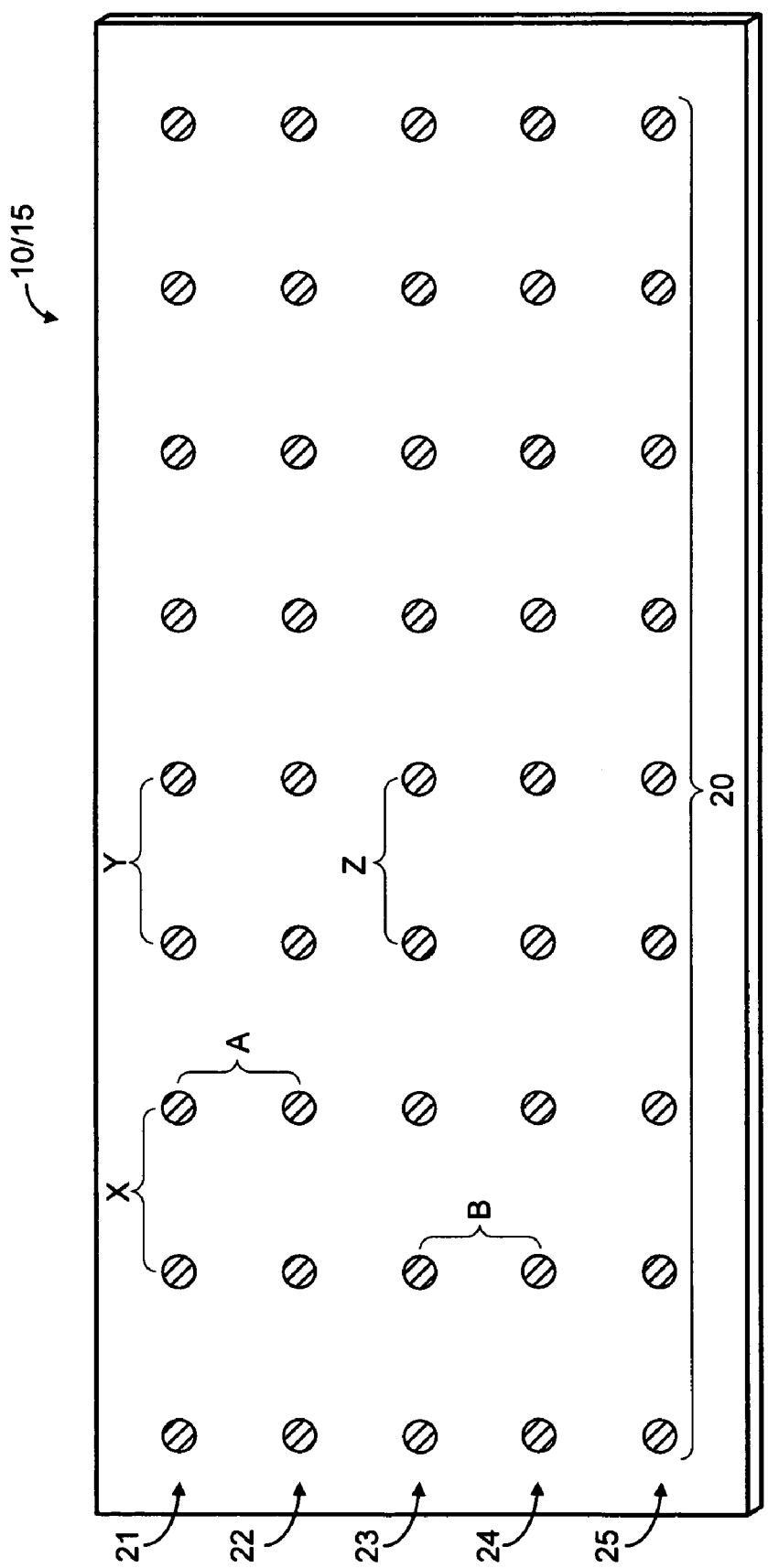
FIG. 3 is a top view of a portion of an electrical interface for a memory connector according to some embodiments.

FIG. 3 is a close-up view of a portion of substrate 10 including footprint 15 according to some embodiments. Conductive contacts 20 may comprise, but are not limited to, copper or lead-based contacts fabricated upon substrate 10. Contacts 20 may be recessed under, flush with, or extending above substrate 10, and may be electrically coupled to respective conductive traces of substrate 10. Although the embodiments herein show conductive contacts 20 having substantially circular cross section, contacts of different and/or varying cross-sectional shapes may be employed in some embodiments.

Each conductive contact 20 of row 21 is to receive a respective one of a first plurality of interconnects of a memory connector. Row 22 is adjacent to row 21, and each conductive contact 20 of row 22 is to receive a respective one of a second plurality of interconnects of the memory connector. Also adjacent to row 22 is row 23, which includes conductive contacts 20 to receive a respective one of a third plurality of interconnects of the memory connector. Moreover, a conductive contact 20 of row 21 is substantially aligned with a conductive contact 20 of row 22, which is in turn substantially aligned with a conductive contact 20 of row 23.

Also shown is row 24 including a plurality of conductive contacts 20 adjacent to row 23. Each of the conductive contacts of row 24 is to receive a respective one of a fourth plurality of interconnects of the aforementioned memory connector. Lastly, row 25 is adjacent to row 24 and includes conductive contacts 20 to receive respective ones of a fifth plurality of interconnects of the memory connector. A conductive contact 20 of row 24 and a conductive contact 20 of row 25 are also substantially aligned with conductive contacts of rows 21 through 23.

In some embodiments, a distance X between two adjacent conductive contacts 20 of one of rows 21 through 25 is approximately equal to a distance Y between two other adjacent contacts 20 of the row and/or a distance Z between two adjacent contacts 20 of another row. A distance A between conductive contacts 20 of two adjacent rows may also or alternatively be approximately equal to a distance B between conductive contacts 20 of two other adjacent rows. According to some embodiments, the distance X (e.g. 2.8 mm) may be approximately double the distance A (e.g. 1.4 mm.).

Figure 4:
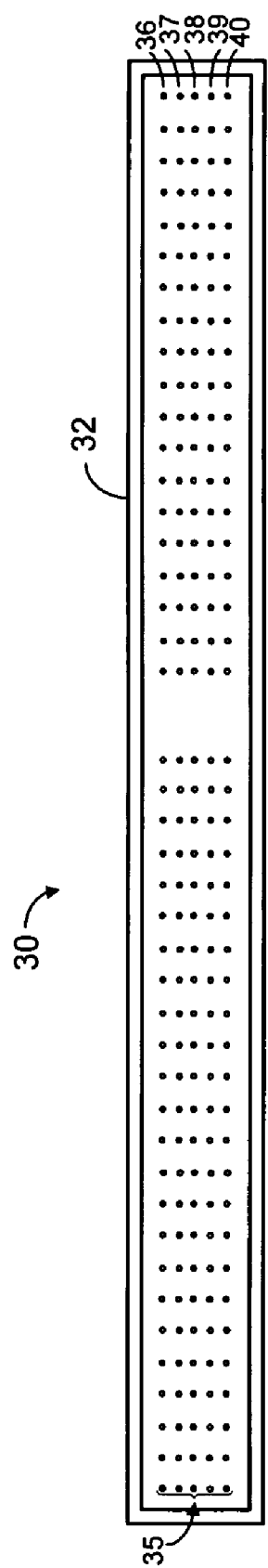
FIG. 4 is a bottom view of a memory connector showing interconnect ends according to some embodiments.

FIG. 4 is a bottom view of a portion of memory connector 30 according to some embodiments. Connector 30 may interface with footprint 15 of substrate 10. More particularly, connector 30 includes base 32 with interconnect ends 35 extending therefrom. Each of interconnect ends 35 may electrically connect to a respective one of conductive contacts 20 of footprint 15, either directly or via a socket that is in turn mounted to substrate 15. In this regard, interconnect ends 35 may comprise pins, solder bumps, and/or any other element for electrically coupling to contacts 20. In specific examples, interconnect ends 35 comprise tin or tin/lead-plated phosphor-bronze.

As shown, interconnect ends 35 are arranged in rows 36 through 40. Interconnect ends 35 of adjacent rows are substantially aligned with one another. Since interconnect ends 35 are to be electrically connected to contacts 20, the spacing of interconnect ends 35 may be analogous to the spacing of contacts 20. For example, a distance between two adjacent interconnect ends 35 of a row may be approximately double a distance between interconnect ends 35 of adjacent rows. A distance between interconnect ends 35 of two adjacent rows may be approximately equal to a distance between interconnect ends 35 of two other adjacent rows. Moreover, a distance between two adjacent interconnect ends 35 of a row may be approximately equal to a distance between two adjacent interconnect ends 35 of the row or of another row.

Figure 5:
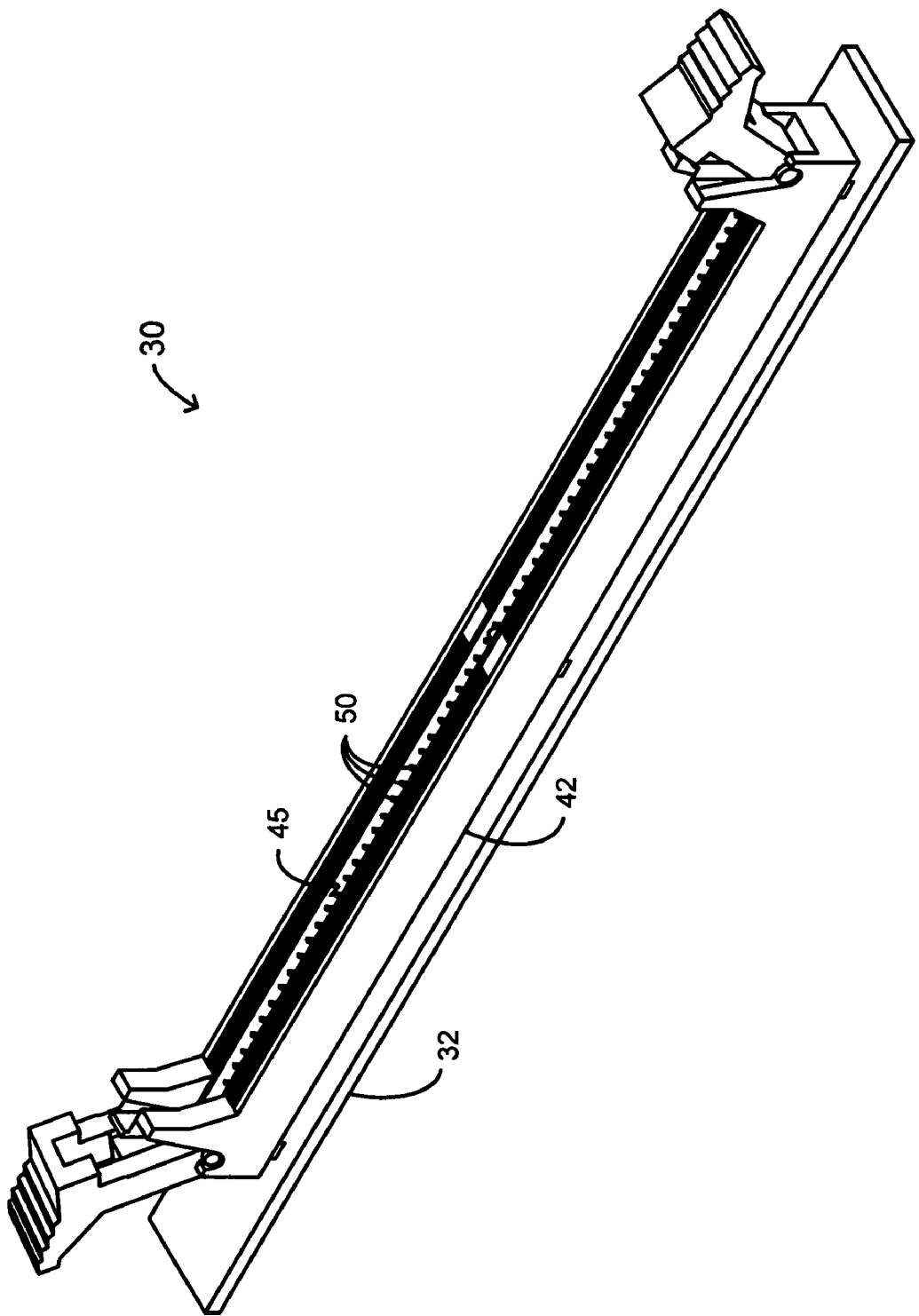
FIG. 5 is a perspective view of a memory connector according to some embodiments.

FIG. 5 is a perspective view of memory connector 30 according to some embodiments. Connector 30 may be used to hold an electrical module and to electrically couple the electrical module to a substrate. Connector 30 includes base 32 and receptacle 42. Base 32 and receptacle 42 may be coupled using any suitable coupling. In one example, base 32 and receptacle 42 are integrally formed from a single mold.

Receptacle 42 defines opening 45 in which an electrical module may be received. Contacts 50 reside in opening 45 to receive respective connection pads of an electrical (e.g., memory) module inserted into opening 45. Contacts 50 may comprise phosphor-bronze or brass according to some embodiments.

Figure 6:
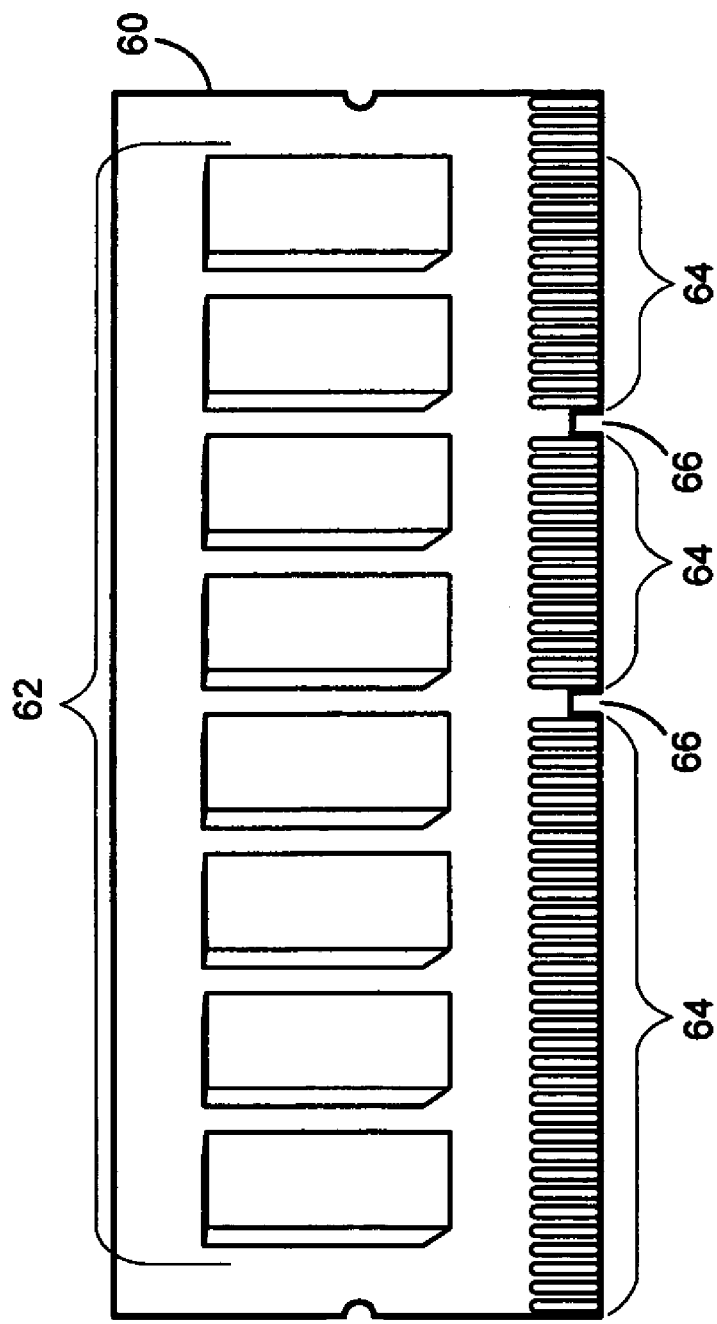
FIG. 6 is a perspective view of a dual in-line memory module.

FIG. 6 is a view of an electrical module that may be used in conjunction with some embodiments. According to some embodiments, module 60 comprises a DIMM supporting high-speed differential signals. Module 60 includes integrated circuits 62, connection pads 64 and mounting structures 66. Although FIG. 6 illustrates only one side of module 60, the unshown side also includes additional connection pads 64 and may include additional integrated circuits 62.

As mentioned above, connection pads 64 may be electrically connected to contacts 50 in a case that module 60 is received in opening 45. Receptacle 42 may include structures corresponding to mounting structures 66 to enable a secure physical connection between receptacle 42 and module 60, and also to ensure that module 60 is compatible with receptacle 42 and the electrical bus to which receptacle 42 is connected. Other types of electrical modules which differ in electrical function, physical configuration or otherwise from module 60 may be used in conjunction with some embodiments. As non-exhaustive examples, module 70 may be a DDR DIMM with a same or different physical configuration, a Fully-Buffered DIMM with a same or different physical configuration, another type of memory module (e.g., a Single In-Line Memory Module (SIMM)), and/or a module having a same or different physical configuration that provides a function other than memory storage.

Figure 7:
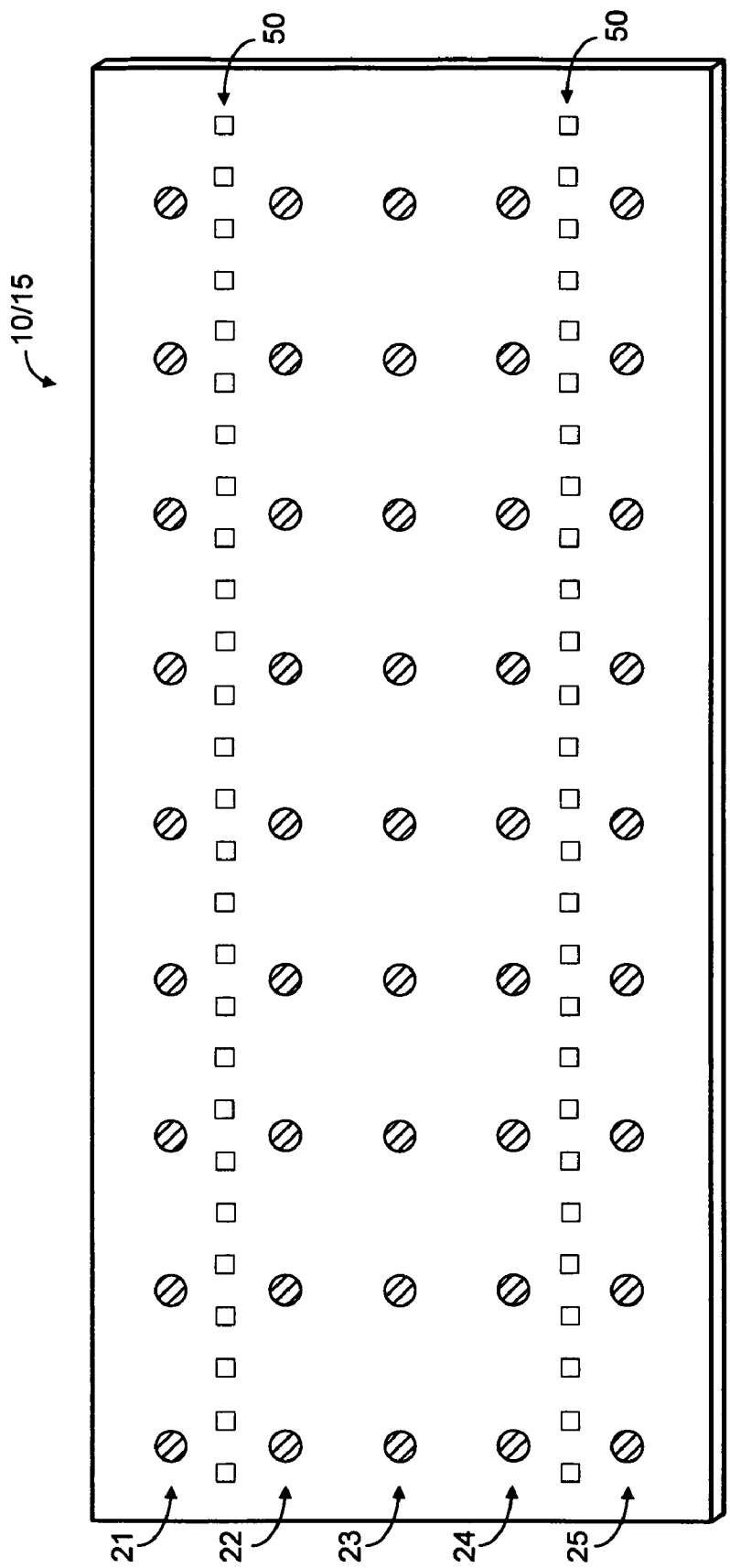
FIG. 7 is a top view of a portion of an electrical interface for a memory connector illustrating relative positions of connector contacts according to some embodiments.

FIG. 7 illustrates a relative position of contacts 50 with respect to elements of footprint 15 according to some embodiments. The configuration of FIG. 7 assumes that memory connector 30 is mounted to footprint 15 and, for clarity, removes all elements of connector 30 other than contacts 50. Looking down and perpendicular to the plane of the page, a first row of contacts 50 is disposed above footprint 15 and between rows 24 and 25 of conductive contacts 20. Similarly, a second row of contacts 50 is disposed above footprint 15 and between rows 21 and 22 of conductive contacts 20.

Figure 8:
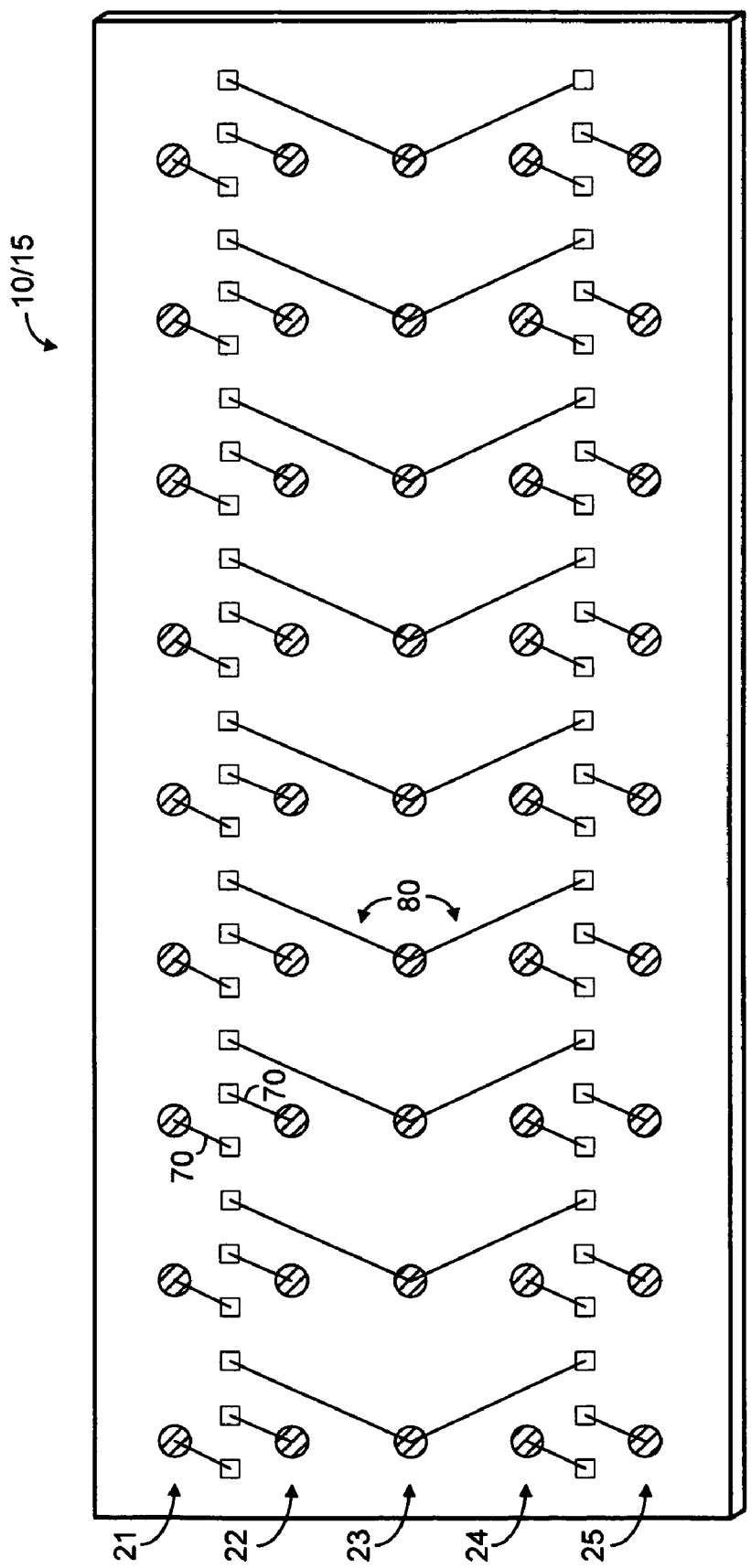
FIG. 8 is a top view of a portion of an electrical interface for a memory connector illustrating relative positions of connector contacts and electrical connections therebetween according to some embodiments.

FIG. 8 illustrates electrical interconnections between the elements of FIG. 7 according to some embodiments. In the illustrated embodiment, conductive contacts 20 of row 23 are electrically connected to ground (e.g., via a ground layer of substrate 10) as well as to respective ones of contacts 50. Conductive contacts 20 of rows 21, 22, 24 and 25 are electrically connected to power or signal traces of substrate 10 and to other ones of contacts 50.

The illustrated electrical interconnections may be provided by conductive interconnects 70 and 80 within receptacle 42 of connector 30. Interconnects 70 and 80 include interconnect ends 35 and may reflect any structure and/or composition that is or becomes known. In some examples, interconnects 80 coupled to contacts 20 of row 23 comprise dual-path "Y" configuration pins. Such an interconnect 80 may be coupled to two contacts 50 but include only one interconnect end 35 for coupling to one conductive contact 20 of row 23.

Figure 9:
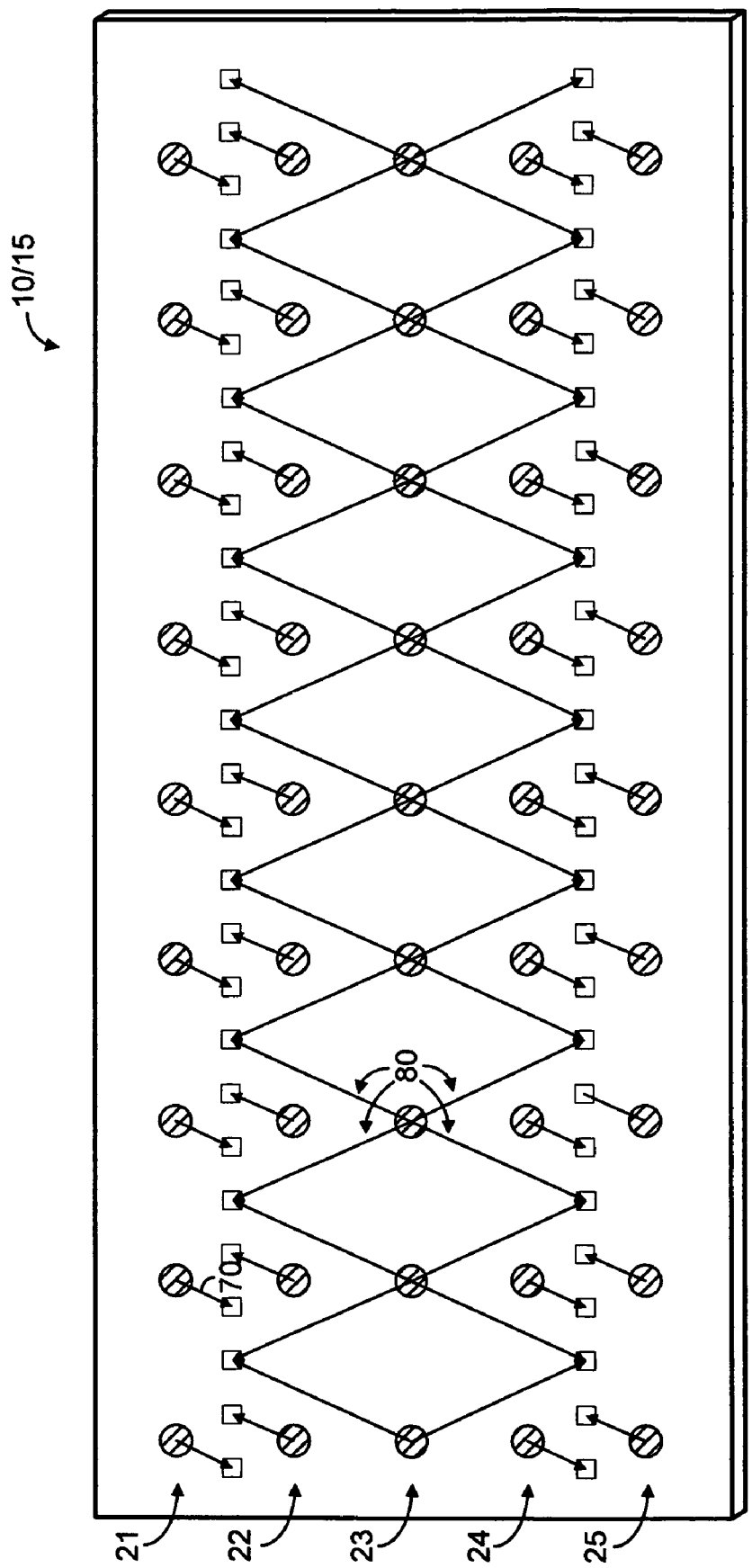
FIG. 9 is a top view of a portion of an electrical interface for a memory connector illustrating relative positions of connector contacts and electrical connections therebetween according to some embodiments.

FIG. 9 illustrates electrical interconnections between the elements of FIG. 7 according to some embodiments. As described with respect to FIG. 8, interconnects 70 electrically connect couple conductive contacts 20 of rows 21, 22, 24 and 25 to power or signal traces of substrate 10 and to contacts 50 as illustrated. Each of interconnects 90 are electrically connected to four of contacts 50 but include only one interconnect end 35 for coupling to one conductive contact 20 of row 23. Such an interconnect 90 may be electrically connected to ground and may comprise a quad-path "double Y" configuration pin.

Figure 10:
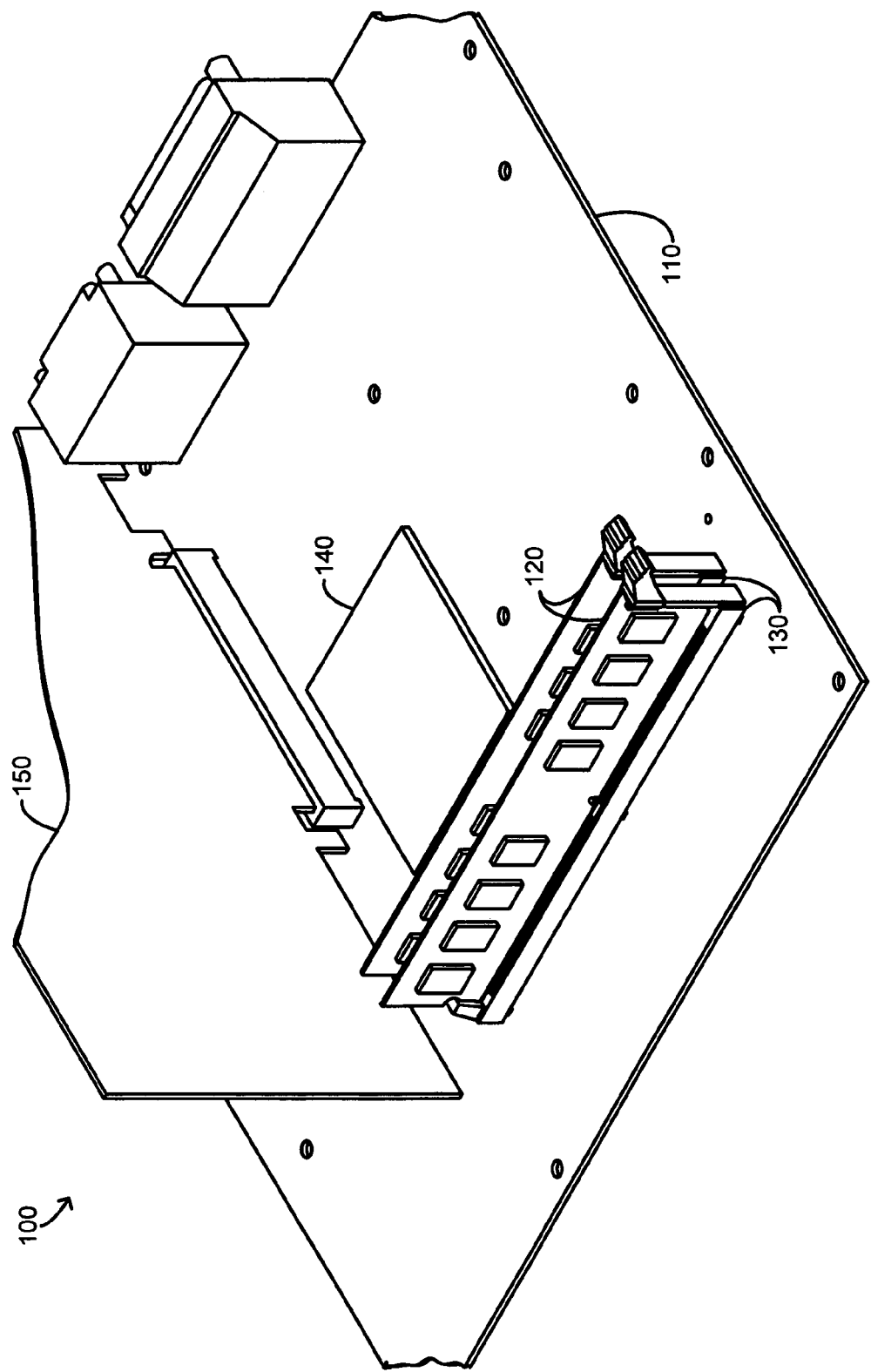
FIG. 10 is a perspective view of a system according to some embodiments.

FIG. 10 illustrates a system according to some embodiments. System 100 may, according to some embodiments, be or include a PC, server, and/or other computational or electrical device. In some embodiments, system 100 may be configured in compliance with an ATX (see ATX Specification—Version 2.2, 2004), or BTX (see Balanced Technology Extended (BTX) Interface Specification—Version 1.0b, July 2005) form factor. Substrate 110 may, for example, be a PCB such as a motherboard for an ATX or BTX-compliant PC.

Memory modules 120 are mounted in memory connectors 130, which may share characteristics of memory connector 30 described above. Therefore, memory connectors 130 may comprise interconnect ends coupled to conductive contacts arranged according to the foregoing description of conductive contacts 20 of footprint 15. Modules 120 may comprise, for example, any type of memory for storing data, such as a Single Data Rate Random Access Memory (SDR-RAM) DIMM, a DDR-RAM DIMM, a Fully-Buffered RAM DIMM, and/or Programmable Read Only Memory (PROM). System 100 may further comprise a processor 140 and/or an expansion card 150.

Processor 140 may be or include any number of processors, which may be or include any type or configuration of processor, microprocessor, and/or micro-engine that is or becomes known or available. Expansion card 150 may be any type of PCB, daughter board, and/or expansion card that is or becomes known. Processor 140 and expansion card 150 may utilize memory modules 120 (and/or program code stored thereon). In some embodiments, system 100 may include fewer or more components than are shown in FIG. 10.

Figure 11:
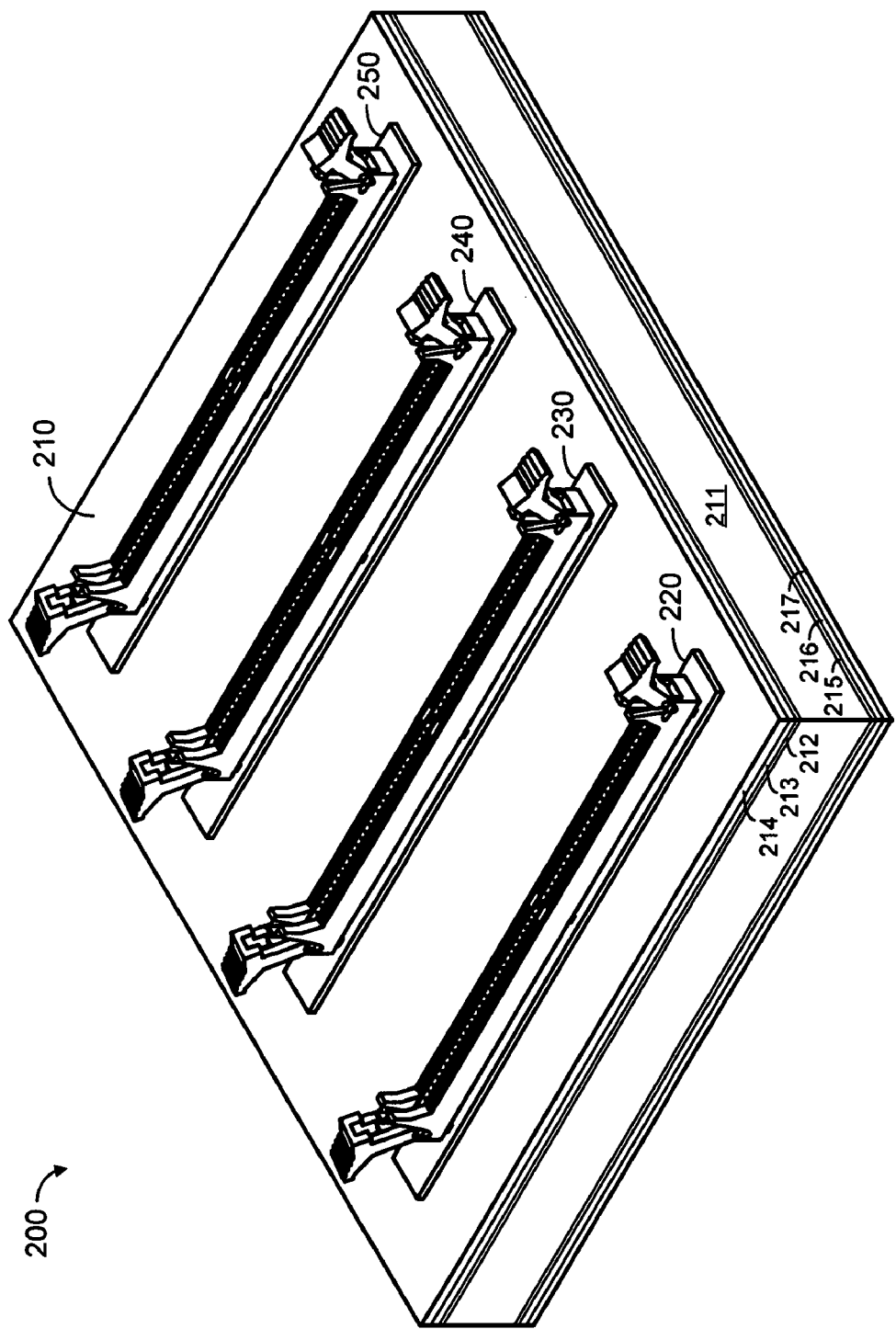
FIG. 11 is a perspective and cutaway view of four memory connectors coupled to a substrate according to some embodiments.

FIG. 11 is a cross-sectional side view of system 200 according to some embodiments. System 200 includes substrate 210 and memory connectors 220 through 250 according to some embodiments. Each of memory connectors 220 through 250 may comprise interconnect ends coupled to conductive contacts arranged as described with respect to footprint 15 of substrate 10.

Substrate 210 may comprise a four-layer substrate, and may comprise any ceramic, organic, and/or other suitable material. Generally, substrate 210 may comprise multiple stacked layers of dielectric material that are separated by conductive layers traces. One plane of conductive traces may be coupled to one or more other planes of conductive traces by vias fabricated within the layers of dielectric material. The dielectric material may comprise any suitable currently- or hereafter-known material or materials, including but not limited to epoxy and glass cloth and epoxy build up material. Other resin materials such as polyamide, polyolefin and cyanate ester could also comprise dielectric material.

Substrate 210 includes core dielectric layer 211. Layer 211 may be composed of any suitable material, including but not limited to bismalemide triazine (BT) and FR4. In some embodiments, layer 211 is approximately 50 mils thick. Stacked upon core layer 211 are power layer 212, dielectric layer 213 and signal layer 214. Shown below core layer 211 are ground layer 215, dielectric layer 216 and signal layer 217. In some embodiments, layers 212 through 217 are approximately 1.2, 2.7, 2.9, 1.7, 2.7 and 2.9 mils thick, respectively.

Power layer 212 may supply reference voltages to electrical components that are connected to substrate 210. Similarly, ground layer 215 may be used to electrically couple the electrical components to ground. Signal layers 214 and 217 may include conductive traces for carrying electrical signals to and from the components, which may include memory modules received by connectors 220 through 250. The aforementioned electrical components may be connected to one or more of layers 212 through 217 by conductive vias that pass through one or more layers of substrate 210.

Figure 12A:
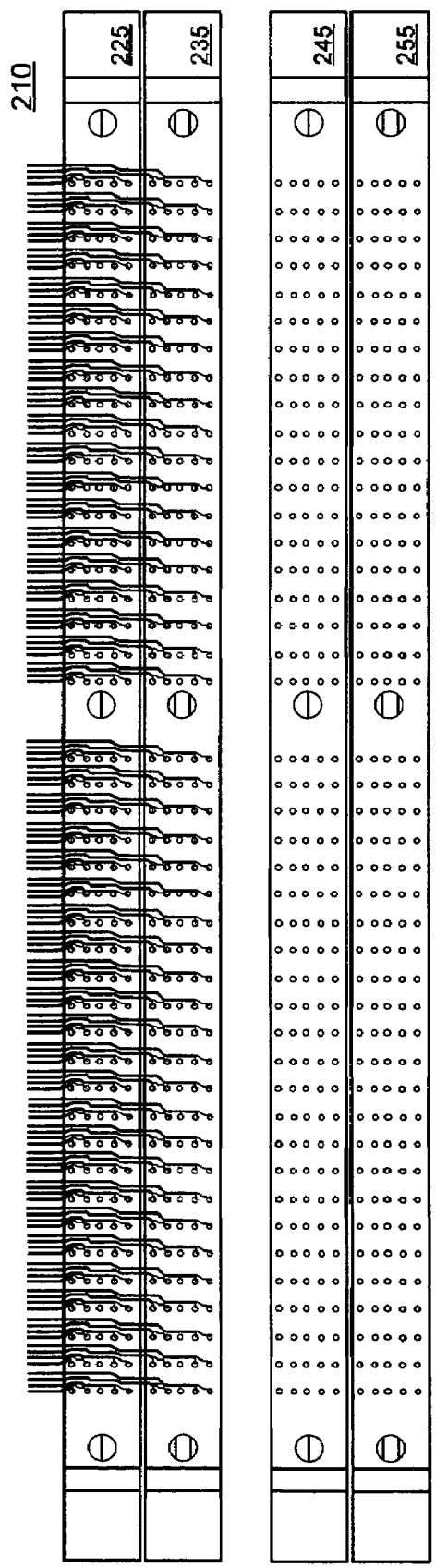
FIGS. 12A and 12B are views of conductive traces routed to conductive contacts of electrical interfaces according to some embodiments.
Figure 12B:
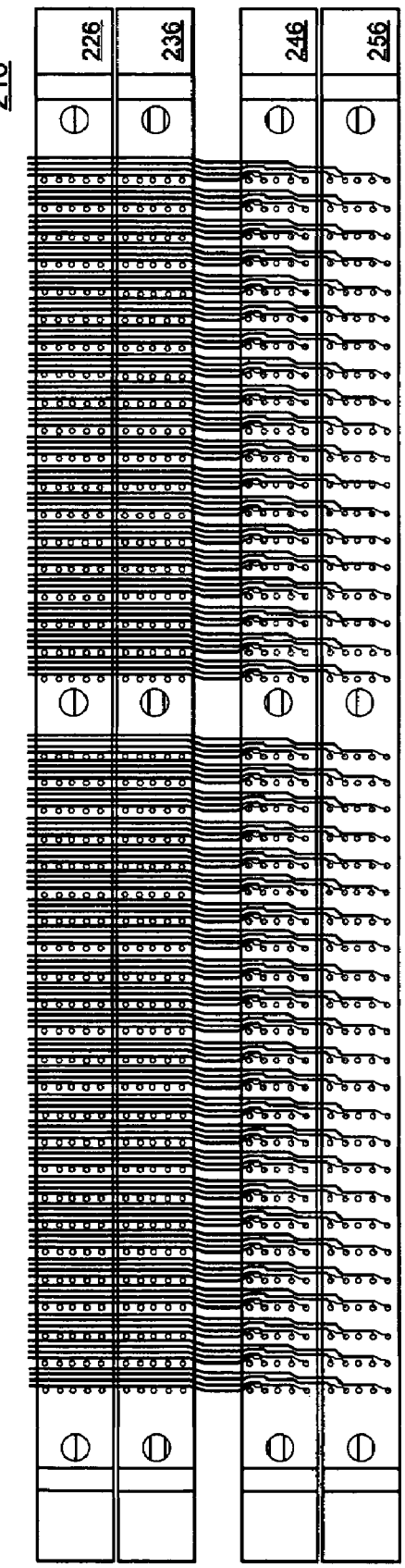

FIGS. 12A and 12B illustrate signal routing between four memory connectors and a four layer substrate according to some embodiments. The illustrated routing may support four memory modules providing differential signaling on four memory channels.

FIG. 12A illustrates four footprints 225, 235, 245 and 255 and associated signal trace routing on a top routing layer of substrate 210 of FIG. 11. Footprints 225, 235, 245 and 255 are to receive respective ones of connectors 220, 230, 240 and 250. FIG. 12B illustrates four footprints 226, 236, 246 and 256 and associated signal trace routing on a bottom routing layer of substrate 210. Footprints 225, 235, 245 and 255 are associated with footprints 225, 235, 245 and 255, respectively. For example, each conductive contact 20 of footprints 245 and 255 may be electrically coupled to a conductive contact of footprints 246 and 256 that lies directly beneath.

Figure 13:
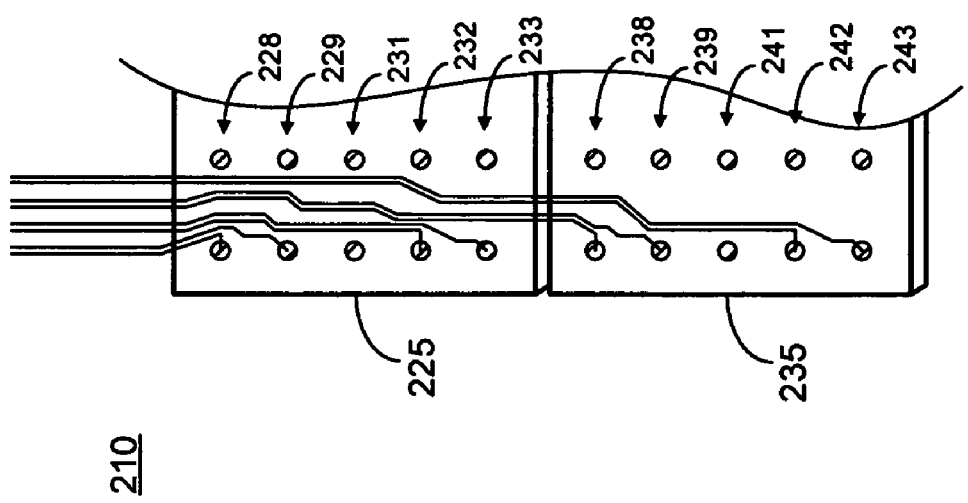
FIG. 13 is a close-up view of conductive traces routed to conductive contacts of electrical interfaces according to some embodiments.

FIG. 13 is a close-up of a portion of the top routing layer of substrate 210 and footprints 225 and 235 as illustrated in FIG. 12A. As shown, footprints 225 and 235 include conductive contacts arranged as described above with respect to FIG. 3.

Conductive traces 227 and 237 are coupled to conductive contacts of footprint 225 and footprint 235, respectively. In some embodiments, each illustrated pair of traces 227 and 237 carries two component signals of a differential signal, such as a high-speed serial differential signal. A differential signal is composed of two component signals, each carried by a separate conductive trace of traces 227 and 237. Accordingly, each of conductive traces 227 and 237 is coupled to a signal layer of substrate 210.

In one specific example, a conductive contact of row 228 is coupled to a first conductive trace of traces 227 to carry a component signal of a first differential signal, and an adjacent conductive contact of row 229 is coupled to a second conductive trace of traces 227 to carry a second component signal of the first differential signal. Additionally, a conductive contact of row 231 may be electrically connected to ground as mentioned with respect to FIGS. 7 and 8.

In some embodiments, a conductive contact of row 232 is coupled to a third conductive trace of traces 227 to carry a component signal of a second differential signal, and an adjacent conductive contact of row 233 is coupled to a fourth conductive trace of traces 227 to carry a second component signal of the second differential signal. Rows 238 through 243 of footprint 235 may be similarly coupled to conductive traces to carry component signals of a third differential signal and a fourth differential signal, with a conductive contact of row 241 being electrically connected to ground. The foregoing description of FIG. 13 may also describe trace routing to footprints 246 and 256 on a bottom routing layer of substrate 210 on as shown in FIG. 12B.

The several embodiments described herein are solely for the purpose of illustration. Embodiments may include any currently or hereafter-known elements that provide functionality similar to those described above. Therefore, persons skilled in the art will recognize from this description that other embodiments may be practiced with various modifications and alterations.

What is claimed is:

1. A system comprising:
  a double data rate dual in-line memory module; and
  a connector holding the memory module, the connector comprising:
  a first row of connectors;
  a first row of a first plurality of interconnect ends adjacent to a first side of the first row of connectors;
  a second row of a second plurality of interconnect ends adjacent to a second side of the first row of connectors;
  a third row of a third plurality of interconnect ends adjacent to the second row of a second plurality of interconnect ends,
  a second row of connectors;
  a fourth row of a fourth plurality of interconnect ends adjacent to the third row of a third plurality of interconnect ends and adjacent to a first side of the second row of connectors; and
  a fifth row of a fifth plurality of interconnect ends adjacent to the fourth row of a fourth plurality of interconnect ends and adjacent to a second side of the second row of connectors,
  wherein a first interconnect end of the first plurality of interconnect ends is coupled to a first connector of the first row of connectors, wherein a first interconnect end of the second plurality of interconnect ends is coupled to a second connector of the first row of connectors, wherein a first interconnect end of the third plurality of interconnect ends is coupled to a third connector of the first row of connectors and is coupled to a third connector of the second row of connectors, wherein a first interconnect end of the fourth plurality of interconnect ends is coupled to a first connector of the second row of connectors, and wherein a first interconnect end of the fifth plurality of interconnect ends is coupled to a second connector of the second row of connectors.

2. A system according to claim 1, further comprising:
a substrate comprising:
a sixth row of a first plurality of conductive contacts, each of the first plurality of conductive contacts electrically connected to a respective one of the first plurality of interconnect ends;
a seventh row of a second plurality of conductive contacts adjacent to the fourth row, each of the second plurality of conductive contacts electrically connected to a respective one of the second plurality of interconnect ends; and
a eighth row of a third plurality of conductive contacts adjacent to the fifth row, each of the third plurality of conductive contacts electrically connected to a respective one of the third plurality of interconnect ends,
wherein a conductive contact of the first plurality of conductive contacts, a conductive contact of the second plurality of conductive contacts, and a conductive contact of the third plurality of conductive contacts are substantially aligned.

3. The system of claim 1, wherein one of the first row of the first plurality of interconnect ends, the second row of the second plurality of interconnect ends, the third row of the third plurality of interconnect ends, the fourth row of the fourth plurality of interconnect ends, or the fifth row of the fifth plurality of interconnect ends is coupled to a first layer of a substrate, and four of the first row of the first plurality of interconnect ends, the second row of the second plurality of interconnect ends, the third row of the third plurality of interconnect ends, the fourth row of the fourth plurality of interconnect ends, and the fifth row of the fifth plurality of interconnect ends are coupled to a second layer of a substrate.

4. A system according to claim 1, wherein a second interconnect end of the first plurality of interconnect ends is coupled to a fourth connector of the first row of connectors, wherein a second interconnect end of the second plurality of interconnect ends is coupled to a fifth connector of the first row of connectors, wherein a second interconnect end of the third plurality of interconnect ends is coupled to the third connector of the first row of connectors, is coupled to the third connector of the second row of connectors, is coupled to a sixth connector of the first row of connectors, and is coupled to a sixth connector of the second row of connectors, wherein an second interconnect end of the fourth plurality of interconnect ends is coupled to a fourth connector of the second row of connectors, and wherein an second interconnect end of the fifth plurality of interconnect ends is coupled to a fifth connector of the second row of connectors.

5. A system according to claim 1,
wherein the interconnect end of the first plurality of interconnect ends is to carry a first component signal of a first differential signal, the interconnect end of the second plurality of interconnect ends is to carry a second component signal of the first differential signal, and the interconnect end of the third plurality of interconnect ends is to be electrically connected to ground.

6. A system according to claim 5, wherein the interconnect end of the fourth plurality of interconnect ends is to carry a first component signal of a second differential signal, and the interconnect end of the fifth plurality of interconnect ends is to carry a second component signal of the second differential signal.

7. A system according to claim 1,
wherein a first distance between two adjacent interconnect ends of the first plurality of interconnect ends is approximately double a second distance between the interconnect end of the first plurality of interconnect ends and the interconnect end of the second plurality of interconnect ends.

8. A system according to claim 7,
wherein a third distance between the interconnect end of the second plurality of interconnect ends and the interconnect end of the third plurality of interconnect ends is approximately equal to the second distance.

9. A system according to claim 7,
wherein a third distance between a second interconnect end of the first plurality of interconnect ends and a second interconnect end of the second plurality of interconnect ends is approximately equal to the second distance.

10. A system according to claim 7,
wherein a third distance between the interconnect end of the first plurality of interconnect ends and a second interconnect end of the first plurality of interconnect ends is approximately equal to the first distance.

11. An electrical interface to receive a memory module, comprising:
a first row of connectors;
a first row of a first plurality of interconnect ends adjacent to a first side of the first row of connectors;
a second row of a second plurality of interconnect ends adjacent to a second side of the first row of connectors;
a third row of a third plurality of interconnect ends adjacent to the second row of a second plurality of interconnect ends;
a second row of connectors;
a fourth row of a fourth plurality of interconnect ends adjacent to the third row of a third plurality of interconnect ends and adjacent to a first side of the second row of connectors; and
a fifth row of a fifth plurality of interconnect ends adjacent to the fourth row of a fourth plurality of interconnect ends and adjacent to a second side of the second row of connectors,
wherein first interconnect end of the first plurality of interconnect ends is coupled to a first connector of the first row of connectors, wherein a first interconnect end of the second plurality of interconnect ends is coupled to a second connector of the first row of connectors, wherein a first interconnect end of the third plurality of interconnect ends is coupled to a third connector of the first row of connectors and is coupled to a third connector of the second row of connectors, wherein a first interconnect end of the fourth plurality of interconnect ends is coupled to a first connector of the second row of connectors, and wherein a first interconnect end of the fifth plurality of interconnect ends is coupled to a second connector of the second row of connectors.

12. The connector of claim 11, wherein one of the first row of the first plurality of interconnect ends, the second row of the second plurality of interconnect ends, the third row of the third plurality of interconnect ends, the fourth row of the fourth plurality of interconnect ends, or the fifth row of the fifth plurality of interconnect ends is coupled to a first layer of a substrate, and four of the first row of the first plurality of interconnect ends, the second row of the second plurality of interconnect ends, the third row of the third plurality of interconnect ends, the fourth row of the fourth plurality of interconnect ends, and the fifth row of the fifth plurality of interconnect ends are coupled to a second layer of a substrate.

13. A connector according to claim 11, wherein a second interconnect end of the first plurality of interconnect ends is coupled to a fourth connector of the first row of connectors, wherein a second interconnect end of the second plurality of interconnect ends is coupled to a fifth connector of the first row of connectors, wherein a second interconnect end of the third plurality of interconnect ends is coupled to the third connector of the first row of connectors, is coupled to the third connector of the second row of connectors, is coupled to a sixth connector of the first row of connectors, and is coupled to a sixth connector of the second row of connectors, wherein an second interconnect end of the fourth plurality of interconnect ends is coupled to a fourth connector of the second row of connectors, and wherein an second interconnect end of the fifth plurality of interconnect ends is coupled to a fifth connector of the second row of connectors.

14. An electrical interface according to claim 11,
wherein the interconnect end of the first plurality of interconnect ends is to carry a first component signal of a first differential signal, the interconnect end of the second plurality of interconnect ends is to carry a second component signal of the first differential signal, and the interconnect end of the third plurality of interconnect ends is to be electrically connected to ground.

15. An electrical interface according to claim 14, wherein the interconnect end of the fourth plurality of interconnect ends is to carry a first component signal of a second differential signal, and the interconnect end of the fifth plurality of interconnect ends is to carry a second component signal of the second differential signal.

16. An electrical interface according to claim 11,
wherein a first distance between two adjacent interconnect ends of the first plurality of interconnect ends is approximately double a second distance between the interconnect end of the first plurality of interconnect ends and the interconnect end of the second plurality of interconnect ends.

17. An electrical interface according to claim 16,
wherein a third distance between the interconnect end of the second plurality of interconnect ends and the interconnect end of the third plurality of interconnect ends is approximately equal to the second distance.

18. An electrical interface according to claim 16,
wherein a third distance between a second interconnect end of the first plurality of interconnect ends and a second interconnect end of the second plurality of interconnect ends is approximately equal to the second distance.

19. An electrical interface according to claim 16,
wherein a third distance between the interconnect end of the first plurality of interconnect ends and a second interconnect end of the first plurality of interconnect ends is approximately equal to the first distance.

* * * * *